(12) United States Patent
Denzene et al.

(10) Patent No.: US 6,629,365 B2
(45) Date of Patent: Oct. 7, 2003

(54) METHOD OF PROVIDING ENVIRONMENTAL PROTECTION TO AN ELECTRONIC ENCLOSURE

(75) Inventors: Quentin Scott Denzene, Apex, NC (US); Edwin John Nealis, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 347 days.

(21) Appl. No.: 09/778,494

(22) Filed: Feb. 7, 2001

(65) Prior Publication Data

US 2001/0004316 A1 Jun. 21, 2001

Related U.S. Application Data

(62) Division of application No. 09/240,409, filed on Jan. 29, 1999, now Pat. No. 6,219,258.

(51) Int. Cl.[7] ................................................ H05K 3/30
(52) U.S. Cl. .................. 29/841; 29/832; 174/35 R; 174/35 MS; 361/818; 361/816
(58) Field of Search .......................... 29/841, 830, 832, 29/855, 856, 883, 527.1, 527.2, 623.2; 174/35 MS, 35 R, 252; 361/816, 818, 800, 796, 752

(56) References Cited

U.S. PATENT DOCUMENTS

| | | | | |
|---|---|---|---|---|
| 4,768,286 A | * | 9/1988 | Ketcham | 29/841 |
| 5,315,480 A | * | 5/1994 | Samarov et al. | 174/252 |
| 5,504,659 A | * | 4/1996 | Acatay et al. | 361/816 |
| 5,550,713 A | * | 8/1996 | Pressler et al. | 361/818 |
| 6,380,487 B1 | * | 4/2002 | Hollenbeck et al. | 29/623.2 |
| 2001/0004316 A1 | * | 6/2001 | Denzene et al. | 361/816 |

FOREIGN PATENT DOCUMENTS

| | | | | |
|---|---|---|---|---|
| JP | 6-275942 | * | 9/1994 | 29/841 |

* cited by examiner

Primary Examiner—Carl J. Arbes
Assistant Examiner—Minh Trinh
(74) Attorney, Agent, or Firm—Coats & Bennett, P.L.L.C.

(57) ABSTRACT

A method of providing environmental protection to an electronic component includes placing an electromagnetic shield having at least one cavity in contact with a circuit board having electrical components thereon so as to substantially enclose at least a first compartment between the circuit board and the shield, the shield includes at least one entry hole connecting to the first compartment. A conformal coating is applied by introducing the conformal coating into the first compartment through the entry hole while holding the shield in contact with the circuit board so that the coating is applied to the exposed portions of the circuit board within the compartment, but not applied to portions of the circuit board contacted by the shield. An electrically conductive gasket may be positioned between and in contact with both the circuit board and the shield before the applying of the conformal coating.

11 Claims, 7 Drawing Sheets

METHOD OF PROVIDING ENVIRONMENTAL PROTECTION TO AN ELECTRONIC ENCLOSURE

This is a divisional of application Ser. No. 09/240,409, filed Jan. 29, 1999, now U.S. Pat. No. 6,219,258, issued Apr. 17, 2001.

FIELD OF THE INVENTION

The present invention relates to the field of electronic enclosures, and more particularly to a method of providing environmental protection to electrical components associated with the enclosures.

BACKGROUND OF THE INVENTION

Telecommunications equipment is typically designed for indoor temperature controlled environments, but is now frequently deployed in outdoor locations. When telecommunications equipment is deployed in outdoor locations, a cabinet is typically used to provide environmental protection and control thermal conditions within the design limits of the telecommunications equipment. The electronic equipment is generally contained in one or more removable card modules that plug into a backplane in the cabinet. The card modules are supported in the cabinet by a subrack and include connectors that mate with corresponding connectors on the backplane. Cooling air flows through the subrack between the card modules to cool the electronics.

An EMI shielded card module, such as one for a wireless communications base station, typically includes a base, a circuit board assembly, and a cover. The secondary side of the circuit board assembly typically rests on the base. There are ground traces plated or etched onto the primary side of the circuit board, which divide the board into sections. The sections are populated with various components. The ground traces are not covered with solder mask, but are left exposed. The cover has walls with locations corresponding to the ground track locations on the primary side of the circuit board. The walls create cavities in the cover. When the cover is placed on the circuit board, each cavity covers a section on the circuit board, creating a compartment that is EMI shielded from the other compartments. Between the cover walls and the ground traces is an electrically conductive gasket to provide electrical contact across the interface between the cover's walls and the exposed ground traces, thereby creating the EMI shield. Screws or other fasteners are used to secure the cover, gasket, and circuit board to the base.

Such card modules are vulnerable to environmental contamination, such as moisture, salt, and other pollutants. For instance, in a salt fog environment, salt and moisture come into contact with the electronics through various routes. One primary route is through areas that are difficult to seal, such as around connectors that may protrude through the base or the cover. Another route is by wicking through very tiny spaces between the screw threads and the base, even when the screws are properly seated and tightened. Still another route is through the gasket seal after it has been attacked and weakened by the exposure to salt fog.

Sealed cabinets are sometimes used to protect the sensitive electronics from the environmental contaminants. Sealed cabinets use closed heating and cooling systems to maintain the electronics in the cabinets within the desired temperature range without exposing the electronics to potentially harmful contaminants. The heating and cooling systems include air conditioners, heaters, and/heat exchangers which consume space in the cabinet and add considerably to the cost of the cabinet. These components also require periodic maintenance to maintain them in proper operating condition.

Ventilated cabinets provide an alternative to sealed cabinets. Ventilated cabinets use natural or forced convection to draw ambient air through the cabinet to cool the equipment inside the cabinet. Ventilated cabinets are less expensive than sealed cabinets, consume less space, and are more easily maintained. However, the electronics on both the card modules and the backplane are typically exposed to the airflow, which may contain environmental contaminants such as moisture, nitrates, hydrocarbons, sulfur dioxide, nitrogen oxides, hydrogen sulfides, chlorine, ozone, salt, and the like.

Some protective methods have been developed, such as the method shown in U.S. Pat. No. 5,527,989 to Leeb, which describes an encapsulation method to protect a circuit board from environment contaminants. However, using the Leeb encapsulation method does not protect connectors or any other components that require visual or physical accessibility, and is therefore not appropriate for many applications.

Alternatively, the card module itself may be sealed against intrusion of the environmental agents. One sealing approach is to hand caulk known gaps. Another approach is to use custom gasketing or custom connectors. However, both these methods are expensive and/or require extensive hand operations.

Another common sealing approach is to conformally coat the circuit board(s) of the card modules. That is, the circuit board and all of its components are completely encapsulated inside of a very thin layer of material that does not affect the function of the circuitry. The material is sprayed, dipped, painted, deposited, or otherwise applied to cover the exposed surfaces of the board and the associated electrical components (except external connector contacts).

One problem with conformal coating of shielded modules concerns the ground traces used for shielding. For proper EMI shielding, it is important for these ground traces to remain bare so as to insure proper electrical contact with the gasket. That is, when the circuit board is conformal coated, the ground traces must not be insulated from the gasket. If they are, the ground traces do not contact the gasket and the EMI shield is not properly formed. Under the prior art, the ground traces would be masked prior to the application of the conformal coating. After the conformal coating process, the masking would be removed from the ground traces leaving them free of coating. Next, the cover, gasket, board, and base would be assembled.

The method of individually masking each ground trace prior to coating and then unmasking after coating requires careful manual labor. The intensive use of surgical blades and delicate handling necessary to cut the masking away from the coated areas makes this method expensive. In addition, since the conformal coating is cut and disturbed during the unmasking process, the desired result expected by conformal coating, i.e., a completely coated surface, may not be met. In particular, the cut areas are potential weak points that the environmental conditions faced by the equipment during deployment, especially salt fog, can attack.

Another problem is that even with conformal coatings, connectors are still subject to attack by corrosive agents. In order to insure proper electrical contact at the connector pins, the connector pins should not be coated. Therefore, both the ground traces and connector contacts need to be masked during the coating process to prevent coating of these elements. Without coating, water or other agents may seep through the joint between the connector parts into the connector pin area and degrade the electrical connection. While water-proof connectors are known, these are generally more expensive and increase the cost of the equipment.

Thus, there remains a need for a simple and economical approach for protecting circuits within electronic enclosures from harmful environmental agents.

SUMMARY OF THE INVENTION

The present invention provides a simple and economical approach for protecting circuits within electronic enclosures from harmful environmental agents. An electromagnetic shield, such as a card module cover, is placed in contact with a circuit board, thereby substantially enclosing a compartment. The shield includes at least one entry hole that leads to the compartment. Preferably, the shield includes a plurality of entry holes leading to a plurality of compartments. With the shield and circuit board held together, conformal coating, such as parylene, is introduced into the compartment(s) through the entry hole. The conformal coating coats the exposed portions of the circuit board within the compartment(s), but does not coat the portions of the circuit board contacted by the shield. Therefore, the contact between the circuit board and the shield is maintained. The entry hole may optionally be covered after the coating is applied. The coating may be applied to just the interior of the compartment(s) or in addition may optionally be applied to the exterior surfaces and over any fasteners. Further, in some embodiments, a cleaning agent is introduced into the compartment(s) to cleanse the compartment's interior surfaces, including the circuit board, before the conformal coating is applied.

Typically, the circuit board includes one or more ground traces that divide the circuit board into sections and preferably form a portion of the overall EMI shielding. The path of the ground traces typically corresponds to the layout of the shield walls. In some embodiments, a optional gasket is used between the circuit board and at least portions of the shield to allow for tolerances and physical variations. The gasket is preferably electrically conductive so that the shield is in electrical contact with the circuit board at least partially through the gasket. The gasket typically overlays the ground traces and is compressed between the ground traces and the compartment walls associated with the shield.

To protect connector contact surfaces, the present invention contemplates the use of a connector seal that forms a barrier preventing entry of environmental contaminants into critical connector interface areas. The connector seal is inserted into the forwardly facing pin cavity of the male connector so that the male pins pierce through the connector seal. When the female connector is joined to the male connector, the front face of the female connector abuts the connector seal in such a manner that the connector seal forms a barrier preventing entry of environmental contaminants into the female pins or on that portion of the male pins that are disposed within the female pins. This connector seal is preferably used in conjunction with the conformal coating process described above such that the connector's circuit board leads are coated by the conformal coating.

The conformal coating method of the present invention requires less manual intervention during manufacturing than traditional conformal coating processes. In addition to eliminating the masking and unmasking steps in the coating process, and optionally providing a means for proper cleaning, the process also optionally seals the threads of the assembled screws and other microscopic gaps in the enclosure to prevent contaminants from entering during outdoor deployment. Also, enclosure's exterior surfaces, and the gasket, are preferably coated with the conformal coating material, thereby providing an additional protective layer against the environment for these components. In addition, by using the connector seal of the present invention, the additional critical area of connector contact points may be protected from the environment, thereby creating a robust protected assembly.

DETAILED DESCRIPTION

Figure 1:
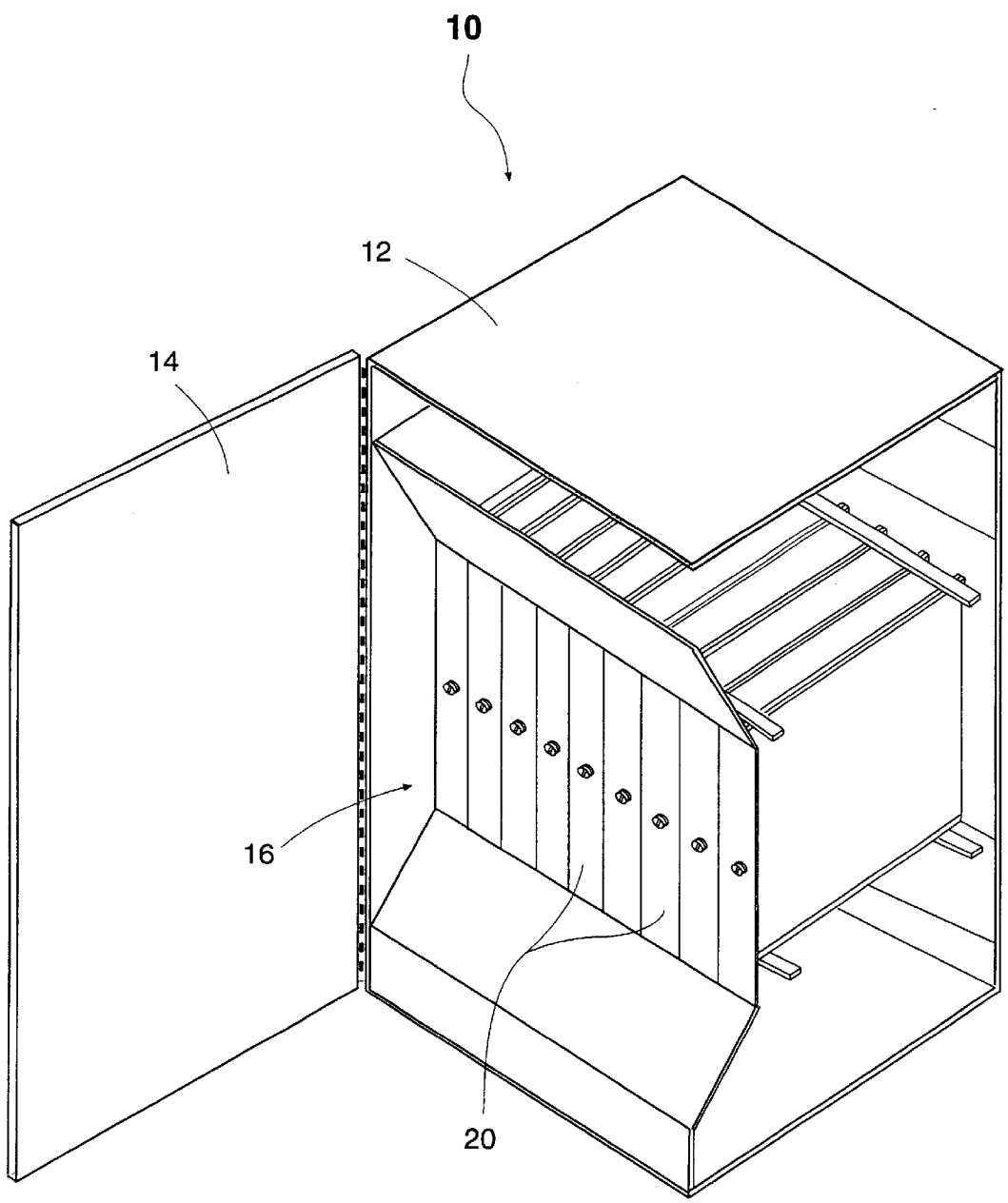
FIG. 1 is a perspective view of a typical electronic equipment cabinet of the prior art.

A typical electronics cabinet 10, such as one for a wireless communications base station, includes a main cabinet body 12, an access door 14, and an internal subrack 16 having one or more card modules 20 inserted therein. See FIG. 1. The card modules 20 are typically removable and include a front panel 22, a circuit board 72 having electrical components 74 thereon, and one or more connectors 100 for attaching to a common backplane 17. The electrical components 74 may be on one side of the circuit board 72, or on both sides. Some card modules 20 require significant EMI shielding. In order to provide a high level of EMI shielding, some modules 20 include a housing 30 that substantially surrounds the problem EMI portions of the circuit board 72, and the electrical components 74 thereon. This housing 30 may substantially enclose only a portion of the circuit board 72, or the entire surface of the circuit board 72 in some embodiments. Due to the wide variety of circuit boards 72 used in card modules 20, the housing 30 may be on only one side of the circuit board 72, or may be on both sides.

Figure 2:
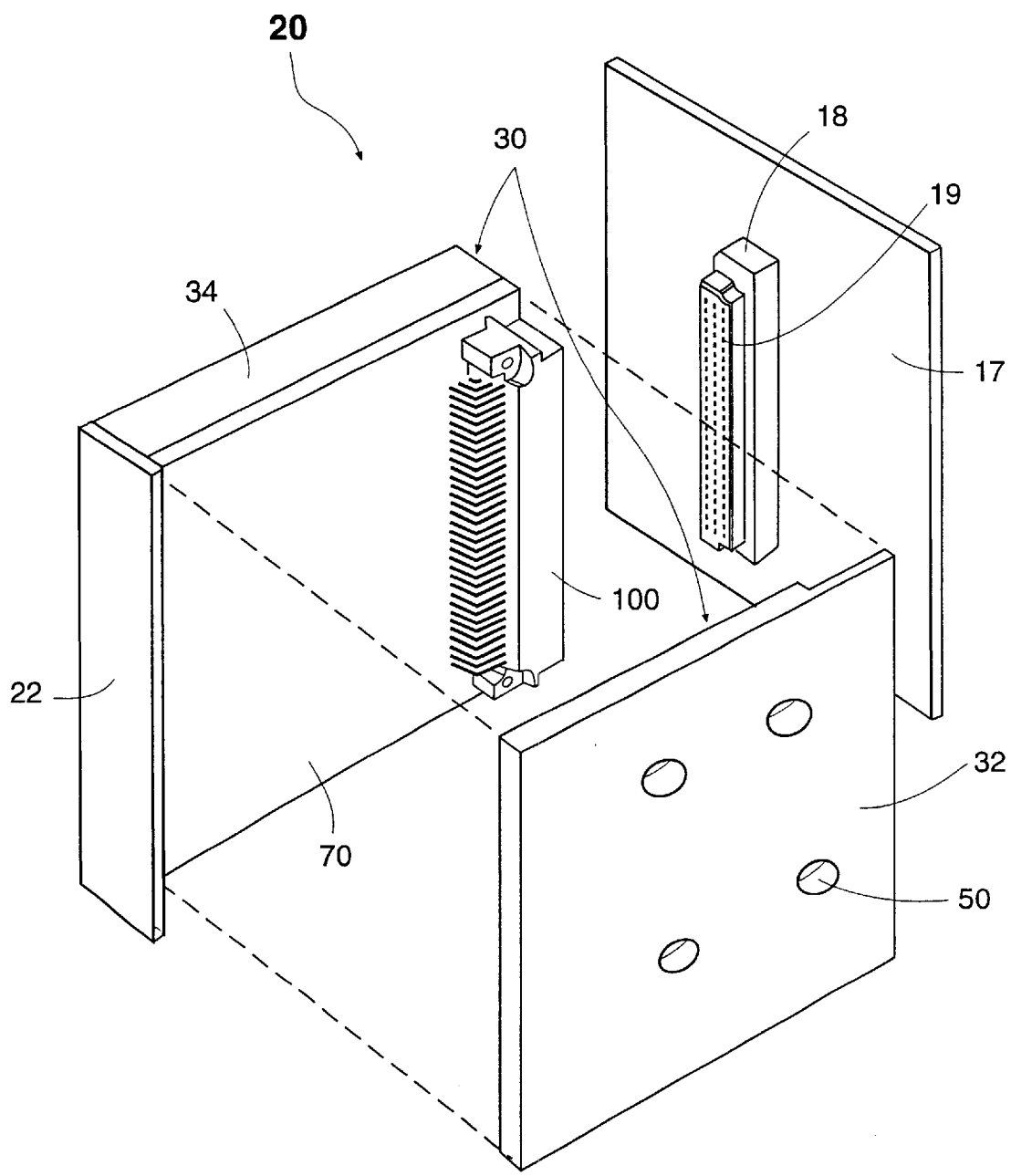
FIG. 2 is a partially exploded perspective view of one embodiment of a card module of the present invention also showing a backplane connector.

The present invention will be illustrated using a card module 20 of the type described above and shown in FIG. 2. However, the approach of the present invention is not limited to only such card modules 20, and may instead be used on any electronics enclosure 20. Further, because the present invention relates to the sealing of the card module 20, and not to the particulars of the mounting of the card module 20 within the subrack 16, a simplified version of a card module 20 will be described to increase clarity. However, as will be appreciated by those of ordinary skill in the art, the card module 20 described below should include the additional mounting features of a normal card module 20, such as a front panel 22, any guide rails, and the like, such features being well known in the art.

Figure 3:
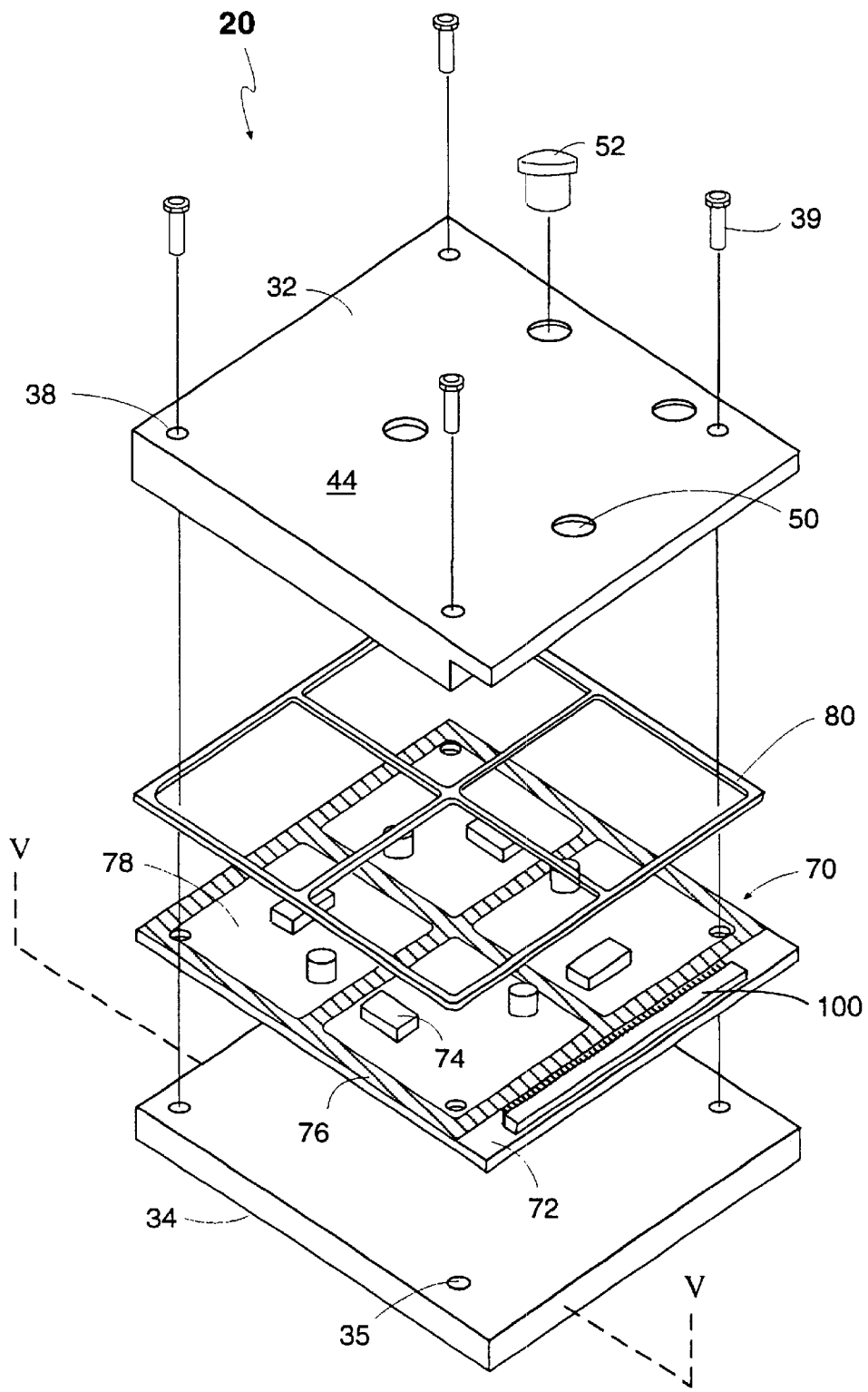
FIG. 3 is partially exploded perspective view of one embodiment of the card module of the present invention.
Figure 4:
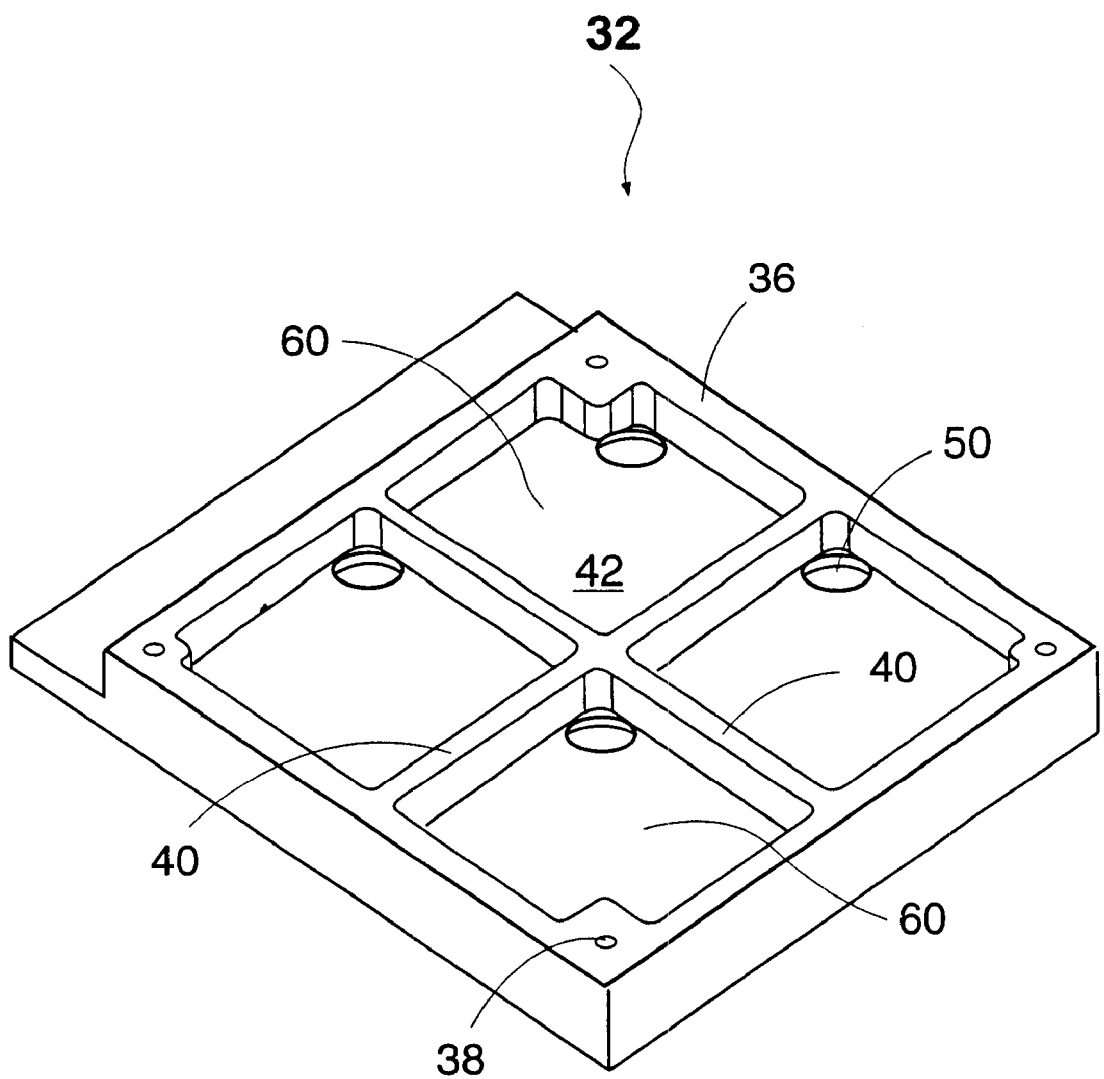
FIG. 4 is an underside view of one embodiment of a cover showing the locations of perimeter walls, interior walls, and entry holes.

An EMI shielded card module 20 typically includes a housing 30, a circuit board assembly 70, and a gasket 80. See FIG. 3. The housing 30 typically includes a cover 32, or shield, and base 34, although the housing 30 may include additional components. The cover 32, shown in greater detail in FIG. 4, is typically rectangular in shape and is bounded by a perimeter wall 36. At the corners of the cover 32 are embossments having screw holes 38 therein. The cover 32 also optionally includes one or more interior walls 40 that subdivide the interior 42, or underside, of the cover 32 into several cavities 60. The bottom edges of the perimeter wall 36 and the interior walls 40 are preferably very smooth so as to provide a uniform mating surface for the gasket 80; however, the mating surface may include a gasket 80 groove if desired. The cover 32 performs the dual functions of mechanically protecting the circuit board assembly 70 and forming at least a portion of the EMI shield.

The base 34 is a generally rectangular body that includes tapped screw holes 35 at each corner that correspond with the screw holes 38 of the cover 32 in number and location. The base 34 may include additional screw holes 35, optionally in conjunction with additional embossments (not shown). These additional screw holes 35 and/or embossments may be used for alignment of the circuit board assembly 70, or simply for additional fastening points to insure proper mating. Of course, there should be corresponding screw holes 38 in the cover 32. The base 34 shown in FIG. 3 is a generally flat body having a generally smooth inner surface. The outer surface may include fins or other features for radiating heat or the like. However, it should be understood that the base 34, like the cover 32, may have cavities on its inner surface for performing similar functions as the cover's cavities 60. In addition, while not shown in FIG. 3, the front panel 22 of the card module 20 may be formed integral with the base 34.

The cover 32 and base 34 are preferably made of a metallic material, such as aluminum, or a metallic coated or impregnated plastic material such as nickel coated polycarbonate.

The circuit board assembly 70 includes a circuit board 72 having various electronic components 74 secured thereto in any conventional manner. The circuit board 72 has one or more ground traces 76 plated or etched onto the primary side of the circuit board 72 that are not covered with solder mask, but are left exposed. These ground traces 76 divide the circuit board 72 into sections 78 that correspond to the cavities 60 of the cover 32. These ground traces 76 are preferably connected to a ground plane on the under side of the circuit board 72 by any suitable means, such as a plurality of closely spaced through holes or vias (not shown). The electronic components 74 may be of any suitable type, depending on the intended use of the electronics. The details of such electronic components 74 is not necessary for understanding the present invention. In addition to the electronic components 74, the circuit board 72 may include one or more connectors 100, switches, indicator lights, or the like, that are intended to be physically viewable or accessible from the exterior 44 of card module 20 when assembled.

The gasket 80 is made of a thin, electrically conductive material. The geometry of the gasket 80 corresponds to the wall geometry of the cover 32 so that the gasket forms a seal between the cover 32 and the circuit board 72. The gasket 80 provides electrical contact across the interface between the walls 36,40 in the cover 32 and the exposed ground traces 76 on the circuit board 72, thereby creating the EMI shield. A preformed gasket 80 may be used, and such is shown in FIG. 3. Alternatively, a dispensed gasket material may be distributed onto the underside edge of the walls 36,40 of the cover 32, or on the ground traces 76 of the circuit board 72, to form a gasket 80. While any number of gasket materials well known in the art are suitable, both the preformed gasket 80 and the dispensed gasket 80 may be made form gold/copper filled silicone, available from Chomerics of Woburne, Mass.

The card module 20 is assembled by placing the circuit board assembly 70 on the base 34, typically secondary side down; overlaying the gasket 80 so as to align with the relevant ground traces 76 on the circuit board 72; placing the cover 32 on top; and joining the two portions of the housing 30. The bottom edges of the perimeter wall 36 and the interior walls 40 of the cover 32 should match up with and compress the gasket 80 against the ground traces on the circuit board 72 so as to form a good electrical contact therewith. In this manner, the cover, or shield, 32 is brought into contact with the circuit board 72. As used herein, the term "contact," as applied to connection between the cover (or shield) 32 and the circuit board 72 means that the cover 32 is either directly physically touching the circuit board 72 and/or that the cover 32 is directly connected to the circuit board 72 through some sort of physical seal such as the gasket 80. Thereafter, screws 39 are inserted into the screw holes 35, 38 and tightened into place. At this point, the card module 20 is assembled, but not yet environmentally protected.

The assembled card module 20 of this illustrative embodiment includes a plurality of interior compartments 66 that are created by the cavities 60 on the underside of the cover 32 being mated to the corresponding sections 78 on the circuit board 72 via the gasket 80. See FIG. 5. A typical compartment 66 includes a ceiling of the underside 42 of the cover 32, a floor of the circuit board 72, and sides of the perimeter wall 36 and/or the interior walls 40 of the cover 32. It is intended that each compartment 66 is EMI shielded from neighboring compartments 66 and the outside world by the electrical connection between the cover 32 and the circuit board 72 via the gasket 80.

The housing 30 of the present invention includes at least one, and preferably a plurality of entry holes 50, preferably in the cover 32 as shown in FIG. 3 and FIG. 4. The entry holes 50 connect their respective compartments 66 to the exterior 44 of the housing 30. Typically, each compartment 66 may be accessed via one entry hole 50, but some compartments 66 may have multiple entry holes 50. To protect the electronic components 74, conformal coating 90 is introduced into the entry holes 50 so as to coat the inside of the respective compartments 66. The conformal coating 90 may be of any type known in the art, including acrylic, epoxy, silicones, parylene, urethane, and the like. Preferably, the conformal coating 90 is parylene type C that coats to a thickness of approximately 0.0007 inch. The conformal coating 90 may be introduced into the entry holes 50 by any known method. For instance, the entire assembled card module 20 may be exposed to a heated gaseous cloud of the coating material 90 and the coating material 90 may be allowed to wick, seep, or otherwise travel to the interior of each compartment 66. Alternatively, the coating material 90 may be sprayed over the exterior 44 of the card module 20 and allowed to enter the compartments 66 through the entry holes 50. Or, the coating material 90 may be selectively sprayed into each entry hole 50. Further, the entire assembled card module 20 may be dipped into a conformal coating bath. It should be noted that, depending on the application method, it may be desirable to cover the pins of any exposed connectors 100 to prevent the contacts from being coated by the conformal coating 90, such as by using a latex mask, tape, or the like.

Figure 5:
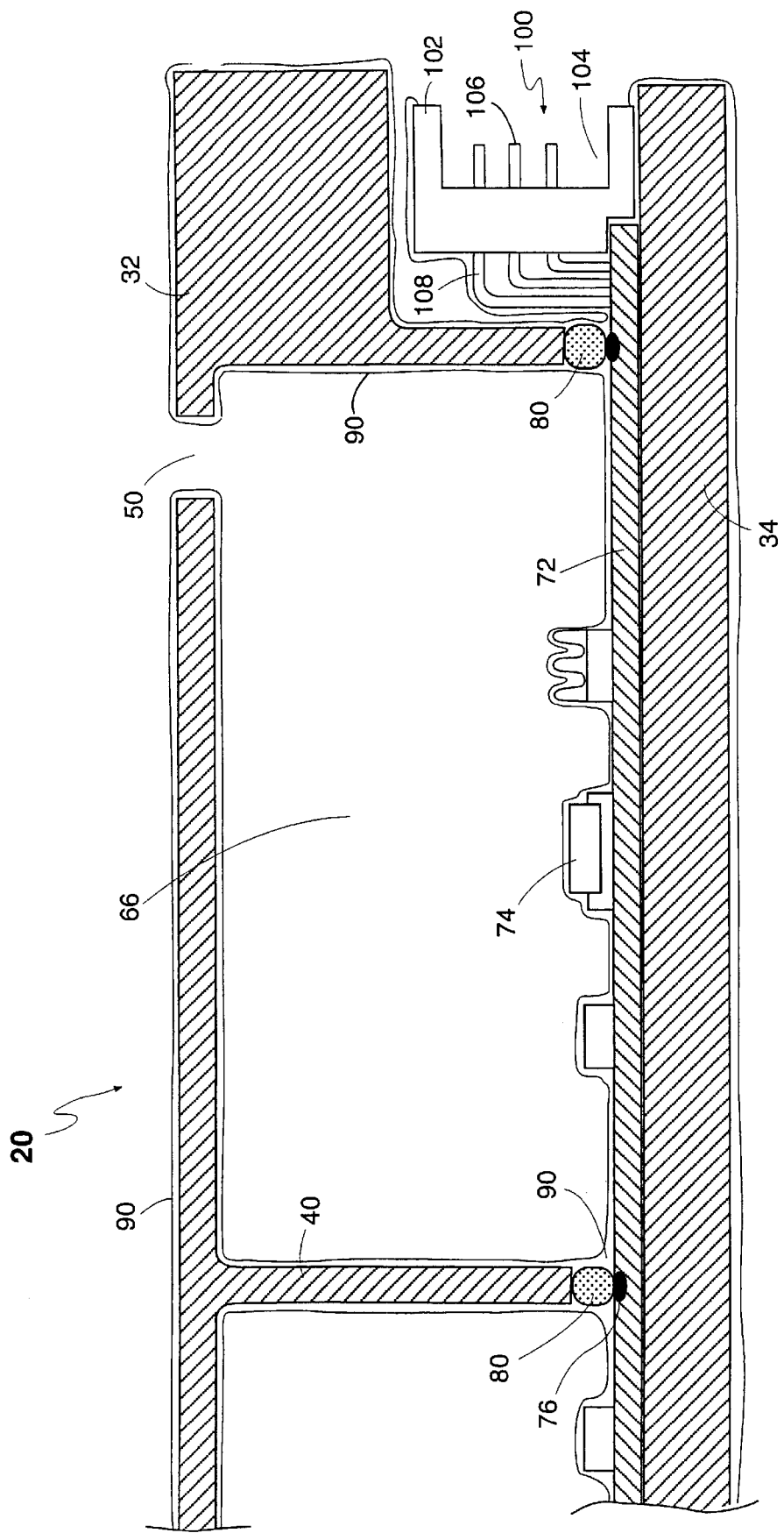
FIG. 5 is a partial sectional view along line V—V in FIG. 3 showing the interior of a compartment.

Referring to FIG. 5, the coating within each compartment 66 should fully coat the portions of the circuit board 72 exposed within the compartment 66, including the associated electronic components 74. In addition, the conformal coating 90 preferably coats the associated gasket 80 portions and the interior portions of the cover's perimeter wall 36 and interior walls 40.

The conformal coating 90 should not form a solid fill of the compartment 66. Instead, the excess conformal coating 90, that not needed to form the desired protective coating, should be drained from the compartment 66 via the entry holes 50. In order to facilitate this, it may be desirable to locate the entry holes 50 in a uniform position relative to their respective compartments 66, such as in a corner thereof, as shown in FIG. 4, so that the card module 20 may be tipped to one side for drainage. The residual conformal coating 90 is thereafter allowed to dry, thereby forming the desired protective coating. The dry coating should coat neither that portion of the circuit board 72, or the cover's walls 36, 40, that are in contact with the gasket 80. That is, the coating should not interfere with the electrical connection between the cover 32 and the circuit board 72 that forms a portion of the EMI shield.

If desired, the entry holes 50 may thereafter be sealed by any suitable means, such as metallic tape, plugs 52, or the like.

It is believed that the entry holes 50 should be sized large enough to admit the proper amount of coating material 90, but not so large as to affect the proper operation of the equipment through EMI permeability. In practice, a hole size of approximately ¼ inch to one inch may be acceptable, depending on the EMI frequencies involved. For instance, for frequencies typically encountered in wireless communications systems, a hole size of approximately ¼ inch may be used.

In some instances, it may be desirable to subject the compartments 66 of the assembled electronic enclosure 20 to cleaning prior to conformal coating. To do so, a cleaning agent may be introduced into the compartments 66, via the entry holes 50, and allowed to flow over the interior surfaces thereof, including the electronic components 74. After suitable time, the cleaning agent may be drained from the compartments 66 through the entry holes 50. Thereafter, the conformal coating 90 may be introduced into the compartments 66 as described above.

It should be noted that the base station circuit card module 20 described above is for illustrative purposes only and is not intended to be the only configuration of electronic enclosure 20 under the present invention. Indeed, while a rectangular shape for the base 34 and cover 32 have been discussed, any geometric shape may be used. Likewise, the electronic enclosure 20 may have a single circuit board 72 or multiple circuit boards 72, may have one compartment 66, two compartments 66, or any number of compartments 66. Furthermore, not all the compartments 66 need to be coated according to this invention, but it is preferred that they are. Moreover, the portions of the housing 30, the cover 32 and the base 34, may be joined by any method known in the art, including screws 39, bolts, adhesives, welding, snaps, clamps, or the like. And, obviously, the electronic enclosure 20 need not be for a base station, but may instead be for any electronics that need to be EMI shielded to protect the electronics themselves or other nearby electronics.

In addition, the cover 32 of the card module 20 described above utilized a substantially uniform and continuous perimeter wall 36 that extends to the outer reaches of the card module 20. However, such is not required. For instance, the perimeter wall 36 may have suitable openings (not shown) to allow for the operation of switches, indicator lights, and connectors 100. Further, the interior walls may have pass-through channels connecting on compartment to another.

Further, in many embodiments, the connectors 100, and particularly the connectors 100 for mating with the backplane 17, are not fully enclosed in a compartment 66, but rather are located outside of the compartments 66. Thus, the circuit board 72 may extend outside the confines of the compartments 66.

While the conformal coating approach described above protects the electrical components 74 on the circuit board 72 by coating them in a protective skin, not all surfaces should necessarily be protected in such a manner. In particular, the connector 100 on the rear edge of the card module 20 for connecting to the backplane 17 should not have all of its surfaces coated with the conformal coating 90. For proper electrical connections between connectors, it is believed that the pins of the connector 100 should be uncoated by the conformal coating 90. However, these surfaces should not be left wholly unprotected from the environment.

Figure 6:
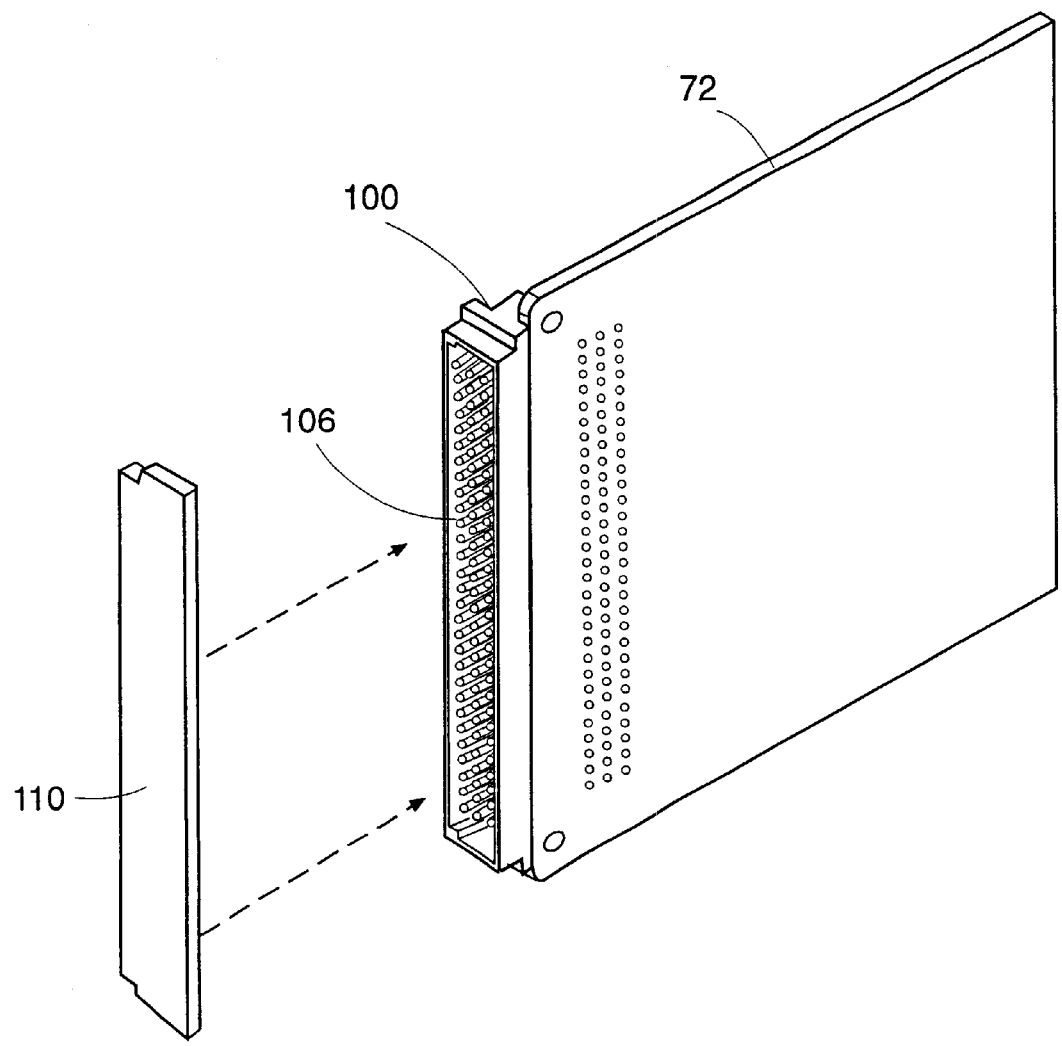
FIG. 6 is partially exploded perspective view showing the connector seal of the present invention.

The connector 100 of the present invention includes a main body 102 having a pin cavity 104 therein. A plurality of male pins 106 project into the pin cavity 104 from the pin cavity's rear surface 105 and a corresponding plurality of leads 108 extend out the rear, or alternatively the bottom, of the connector 100. The leads 108 are in electrical connection with the corresponding pins 106. The construction of such a main body 102, pins 106, and leads 108 is well known in the art and may be exemplified by the common DIN 96-pin male connector 100. In addition, the connector 100 of the present invention includes a connector seal 110. This connector seal 110 is sheet-like pliable, gel-impregnated foam material, such as a material known as Geltek made by Raychem Chemical Co. The connector seal 110 is cut to have a perimeter shape that corresponds to the shape of the pin cavity 104. The connector seal 110 is placed over the pins 106 in the pin cavity 104 and pressed into the pin cavity 104, with the pins 106 piercing the foam 110, to seat against the rear surface 105 of the pin cavity 104. See FIG. 6. When seated, the connector seal 110 adheres to the rear of the pin cavity 104 and the pins 106, and should preferably not inadvertently come out. The connector seal 110 completely surrounds each pin 106 near its base. It should be noted that the leads 108 of the connector 100 are preferably coated during the conformal coating process described above.

Figure 7:
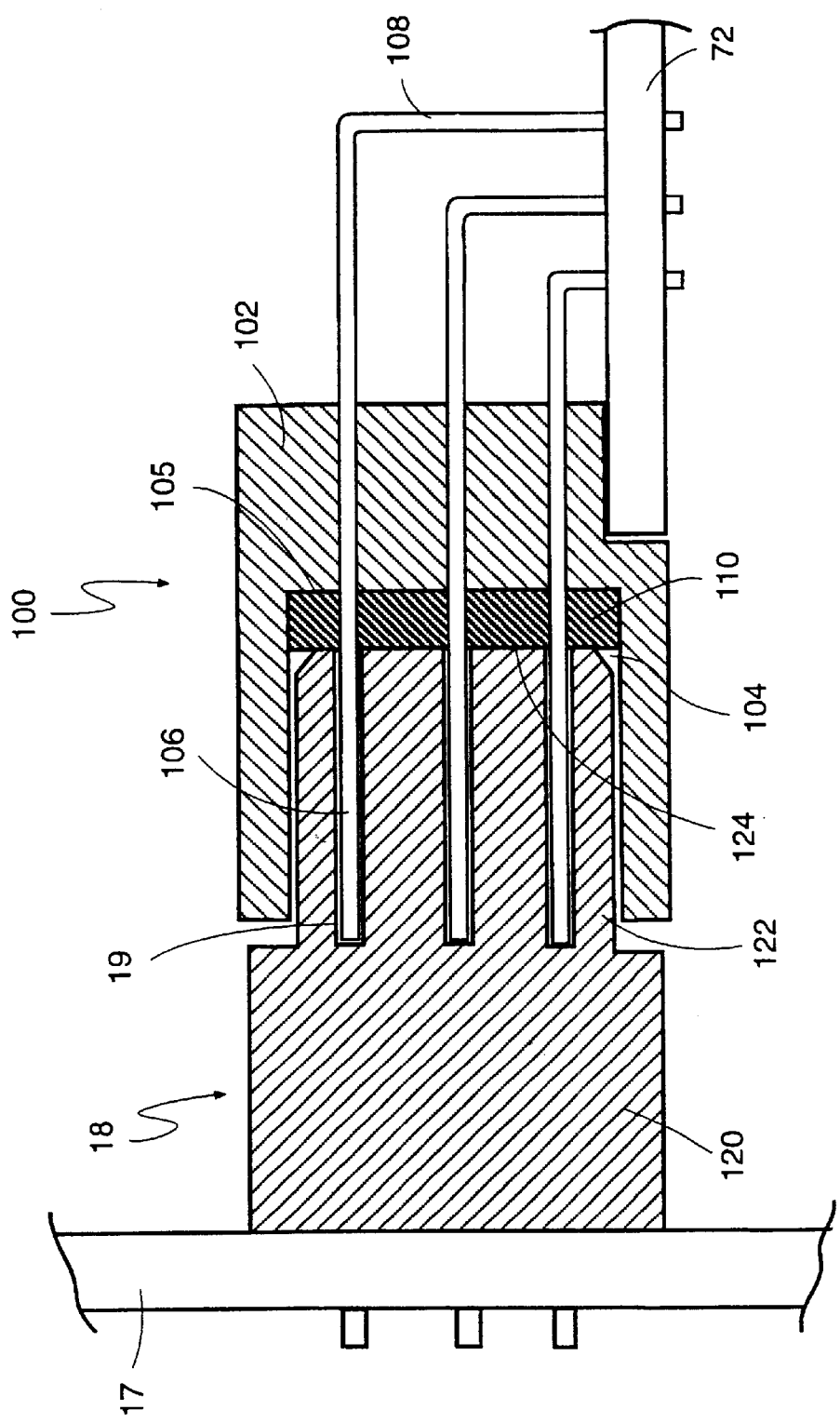
FIG. 7 is partially sectional view of the interface between the card module of the present invention and the backplane with the housing of the card module removed for clarity, showing the connector seal.

When the connector 100 is mated to its female counterpart, such as a connector 18 on the backplane 17, the male pins 106 mate with corresponding female receptacle pins 19 on the female connector 18. The female connector body 120 typically includes an insert portion 122 designed to fit within the pin cavity 104 of the male connector 100. Extending inwardly from the front face 124 of the insert portion 122 are a plurality of female pins 19. The interface between each pair of male and female pins 106,19 is capped by the connector seal 110. See FIG. 7. In this manner, a seal is created to protect the most critical portions of the connector 100, that portion making the electrical connection, from environmental contaminants.

The conformal coating method of the present invention requires less manual intervention during manufacturing. In addition to eliminating the masking and unmasking steps in the coating process, and optionally providing a means for proper cleaning, the process also seals the threads of the assembled screws 39 and other microscopic gaps in the enclosure 20 to prevent contaminants from entering during outdoor deployment. Also, the housing's cover 32 and base 34, along with the gasket 80 are preferably coated with the conformal coating 90 material, thereby providing an additional protective layer against the environment for these components. In addition, by using the connector seal 110 of the present invention, the additional critical area of connector contact points may be protected from the environment, thereby creating a robust protected assembly.

The present invention may, of course, be carried out in other specific ways than those herein set forth without departing from the spirit and essential characteristics of the invention. The described embodiments are, therefore, to be considered in all respects as illustrative and not restrictive, and all changes coming within the meaning and equivalency range of the appended claims are intended to be embraced therein.

What is claimed is:

1. A method of environmentally protecting at least a portion of an interior of an electronic assembly, comprising:

placing an electromagnetic shield having at least one cavity in contact with a circuit board having electrical components thereon so as to substantially enclose at least a first compartment between said circuit board and said shield, said shield including at least one entry hole connecting to said first compartment;

applying a conformal coating by introducing conformal coating into said first compartment through said entry hole while holding said shield in contact with said circuit board so that said coating is applied to an exposed portion of said circuit board within said compartment, but not applied to portions of said circuit board contacted by said shield.

2. The method of claim 1 further including positioning at least one gasket between said circuit board and said shield and in contact with both before said applying a conformal coating.

3. The method of claim 2 wherein said shield and said gasket are electrically conductive, and wherein said circuit board is in electrical contact with said shield through said gasket.

4. The method of claim 1 further including covering said entry hole after said coating is applied.

5. The method of claim 1 further including introducing a cleaning agent into said compartment to cleanse said circuit board before said conformal coating is applied.

6. The method of claim 1 further including joining together said shield and a first housing section so as to substantially enclose said circuit board therebetween before said applying a conformal coating.

7. The method of claim 6 wherein said joining includes screwing together said shield and said first housing section and wherein said conformal coating further covers the exterior portions of said shield and said screws.

8. The method of claim 1 wherein said shield includes a plurality of entry holes.

9. The method of claim 1 wherein said shield includes a plurality of cavities forming a plurality of individual compartments when placed in contact with said circuit board, wherein each compartment communicates with at least one entry hole associated therewith for introducing said conformal coating into said compartment.

10. The method of claim 1 wherein said circuit board includes a multi-pin connector having a connector seal disposed within a pin cavity for forming a barrier to prevent entry of environmental contaminants into female pins on a corresponding female connector when mated to said multi-pin connector.

11. A method of environmentally protecting at least a portion of an interior of an electronic assembly, comprising:

placing an electrically conductive electromagnetic shield having plurality of entry holes and a plurality of cavities in contact with a circuit board having electrical components thereon so as to substantially enclose a plurality of compartments between said circuit board and said shield, wherein each of said compartments connects to at least one of said entry holes;

positioning at least one electrically conductive gasket between said circuit board and said shield, wherein said circuit board is in electrical contact with said shield through said gasket;

joining together said shield and a first housing section so as to substantially enclose said circuit board therebetween; and applying a conformal coating by introducing conformal coating into said compartments through said entry holes while holding said shield in contact with said circuit board so that said coating is applied to an exposed portion of said circuit board within said compartments, but not applied to portions of said circuit board contacted by said shield.

* * * * *